United States Patent [19]
Yamashita

[11] Patent Number: 5,668,754
[45] Date of Patent: Sep. 16, 1997

[54] FERROELECTRIC MEMORY CELL AND READING/WRITING METHOD THEREOF

[75] Inventor: Atsushi Yamashita, Tokyo, Japan

[73] Assignee: NEC Corporation, Tokyo, Japan

[21] Appl. No.: 587,790

[22] Filed: Dec. 26, 1995

[30] Foreign Application Priority Data

Dec. 27, 1994 [JP] Japan .................................. 6-323444

[51] Int. Cl.$^6$ .................................................. G11C 11/22
[52] U.S. Cl. .......................................... 365/145; 365/149
[58] Field of Search .................................. 365/145, 149, 365/117

[56] References Cited

U.S. PATENT DOCUMENTS 5,495,438  2/1996  Omura ...................................... 365/145

FOREIGN PATENT DOCUMENTS 1-158691  6/1989  Japan .

Primary Examiner—David C. Nelms
Assistant Examiner—F. Niranjan
Attorney, Agent, or Firm—Sughrue, Mion, Zinn, Macpeak & Seas

[57] ABSTRACT

A ferroelectric memory cell is provided, which enables to store a plurality of data values therein, and writing and reading methods thereof. The memory cell is includes first to n-th ferroelectric capacitors connected in parallel where n is an integer greater than unity. The first to n-th capacitors have different reverse voltages from each other, where each of the reverse voltages is defined as an applied voltage at which a direction of polarization is reversed. Each of the first to n-th capacitors stores a two-valued information. Each of the first to n-th capacitors stores a two-valued information and therefore, the memory cell can store $2^n$ data values therein. The integration scale can be enhanced.

16 Claims, 7 Drawing Sheets

L1 ---- "00"
L2 ---- "01"
L3 ---- "10"
L4 ---- "11"

FERROELECTRIC MEMORY CELL AND READING/WRITING METHOD THEREOF

BACKGROUND OF THE INVENTION

1. Field of the Invention

The present invention relates to a ferroelectric memory cell and more particularly, to a nonvolatile memory cell using a ferroelectric material as a dielectric placed between a pair of conductive electrodes, which enables to serve as a multi-bit cell, and reading and writing methods thereof.

2. Description of the Prior Art

A ferroelectric has in the ferroelectric state a property that the plot of an electric polarization (or stored charge) versus an electric field (or voltage) shows a hysteresis loop. Specifically, the induced polarization remains even when the electric field or voltage is reduced or increased from saturation to zero, and the direction (or polarity) of the remanent polarization depends upon the past history of the ferroelectric.

Conventionally, the distinctive property of the ferroelectric has been applied to semiconductor nonvolatile memory devices.

A conventional semiconductor nonvolatile memory device using the distinctive property of the ferroelectric has the following basic configuration. A plurality of memory cells, each of which has a single capacitor for storing an information, are arranged in a matrix array. The ferroelectric is used as the dielectric placed between a pair of conductive electrodes and therefore, this capacitor is termed a "ferroelectric capacitor". Also, the memory cell containing the ferroelectric capacitor is termed as a "ferroelectric memory cell".

To access the respective memory cells, necessary interconnection lines such as word lines, bit lines and other relating lines are arranged in the vicinity of the array of the memory cells.

FIG. 1 shows an equivalent circuit of the conventional memory cell of this sort. FIG. 2 shows the plot of stored charges Q versus an applied voltage V, i.e., the V-Q characteristic, of the conventional cell of FIG. 1.

As shown in FIGS. 1 and 2, the conventional memory cell is composed of a single ferroelectric capacitor, and its V-Q characteristic shows a hysteresis loop. In FIG. 2, the characters $V_c$ and $-V_c$ are the reverse voltages at which the stored charge Q is reduced to zero when the applied voltage V is reduced or increased from saturation, respectively. The characters $Q_r$ and $-Q_r$ are the stored or remanent charges when the applied voltage V is reduced or increased to zero from saturation, respectively.

It is seen from FIG. 2 that if two values of a binary data are assigned to the two remanent charges $Q_r$ and $-Q_r$, respectively, the data can be stored in the ferroelectric capacitor. This is the basic concept of the semiconductor ferroelectric nonvolatile memory device.

With the ferroelectric nonvolatile memory device, each memory cell of which contains the ferroelectric capacitor, the cells are usually accessed in the following manner.

Specifically, on a write operation, a suitable pulse of a voltage is applied to a specified one of the cells, thereby inducing a positive or negative remanent polarization (or charge) in the corresponding cell. On a read operation, a suitable pulse of a voltage is applied to a specified one of the cells and an electric current flowing from the corresponding cell due to the stored charge is detected. The magnitude of this current changes dependent upon the presence or absence of the remanent polarization (or charge) and as a result, it can be known whether the cell has the remanent polarization (i.e., stored data value) or not through detection of the current.

To ensure the access to the respective memory cells, selection transistors may be additionally provided for the respective cells. Also, to improve the reliability for the access or read/write performance, dummy memory cells may be provided for the respective cells. Also in these cases, the basic configuration and the read/write operations described above are employed.

The conventional semiconductor ferroelectric nonvolatile memory device described here was, for example, disclosed in the Japanese Non-Examined Patent Publication No. 1-158691 published in June, 1989.

With the conventional ferroelectric memory device, each of the memory cells can store only one data value therein, in other words, each of the memory cells is a single-bit one. This fact causes the following problems when a large number of the memory cells are integrated on a large scale on a semiconductor substrate.

To large-scale integrate the memory cells on the substrate, it is important that the chip area per information (or bit) is as small as possible. With the above conventional memory device, the number of the cells needs to be increased in order to enhance the integration scale. Also, one set of relating interconnection lines is necessary for each of the single-bit cells. Therefore, the chip area per device becomes large with the increasing number of the integrated cells. This means that it is difficult to enhance the integration scale because of the chip area for the relating interconnection lines.

Additionally, because of the difficulty in integration scale enhancement, the fabrication cost per bit increases.

SUMMARY OF THE INVENTION

Accordingly, an object of the present invention is to provide a ferroelectric memory cell that enables the storage of a plurality of data values therein, and writing and reading methods thereof.

Another object of the present invention is to provide a ferroelectric memory cell that can enhance the integration scale with restraining the chip area increase of relating interconnections to the cell, and writing and reading methods thereof.

These objects together with others not specifically mentioned will become clear to those skilled in the art from the following description.

According to a first aspect of the present invention, a ferroelectric memory cell is provided, which includes first to n-th ferroelectric capacitors connected in parallel where n is an integer greater than unity. The first to n-th capacitors have different reverse voltages from each other, where each of the reverse voltages is defined as an applied voltage at which a direction of polarization is reversed. Each of the first to n-th capacitors stores a two-valued information.

With the ferroelectric memory cell according to the first aspect, first to n-th (n>1) ferroelectric capacitors that are connected in parallel and that have different reverse voltages from each other are contained. Also, each of the first to n-th capacitors stores a two-valued information. Therefore, the memory cell can store $2^n$ data values therein.

In addition, since the memory cell has parallel-connected first to n-th ferroelectric capacitors, it occupies a larger chip area than the case where only one ferroelectric capacitor is included. However, the cell can serve as a multi-bit cell capable of $2^n$ data values and requires only one set of interconnection lines.

Accordingly, the total chip area of the memory cell and its interconnection lines is approximately equal to that of the case where only one ferroelectric capacitor is included. As a result, the integration scale can be enhanced with restraining the chip area increase of the relating interconnections to the cell.

In a preferred embodiment of the first aspect, each of the first to n-th capacitors has a ferroelectric and a pair of electrodes placed at each side of the ferroelectric. The ferroelectric of each of the first to n-th capacitors is made of the same material and has a different thickness from each other, thereby making the first to n-th reverse voltages different.

In another preferred embodiment of the first aspect, each of the first to n-th capacitors has a ferroelectric and a pair of electrodes placed at each side of the ferroelectric. The ferroelectric of each of the first to n-th capacitors is made of different materials from each other, thereby making the first to n-th reverse voltages different.

According to a second aspect of the present invention, a method of writing a data value into the ferroelectric memory cell according to the first aspect is provided, which includes the following steps:

The first step is to write a data value into one of the first to n-th capacitors having the relatively highest reverse voltage. The second to (n-1)-th steps are to write data values into the second to (n-1)-th capacitors in descending order of magnitude of their reverse voltages, consecutively. The n-th step is to write a data value into one of the first to n-th capacitors having the relatively lowest reverse voltage.

With the method of writing a data value according to the second aspect, the data values are written into the first to n-th capacitors in descending order of magnitude of their reverse voltages, consecutively. Therefore, after one of the first to n-th capacitors having the relatively highest reverse voltage is written, another of the first to n-th capacitors having the next to the relatively highest reverse voltage is written.

In this stage, since the reverse voltage of the former capacitor is higher than that of the latter, if an applied pulse of a voltage is lower than the relatively highest reverse voltage and higher than the next to the relatively highest reverse voltage, the data value can be written into the latter capacitor and at the same time, the data value that has been written into the former capacitor is not rewritten.

Accordingly, the respective data values can be written into the first to n-th ferroelectric capacitors of the ferroelectric memory cell according to the first aspect without arising any problem.

In a preferred embodiment of the second aspect, each of the first to n-th writing steps is performed by applying a pulse of a voltage to a corresponding one of the first to n-th capacitors. The voltage of the pulse has a value corresponding to a data value to be written and is capable of reversing a direction of electric polarization in the corresponding one of the first to n-th capacitors.

According to a third aspect of the present invention, a method of reading a data value from the ferroelectric memory cell according to the first aspect is provided, which includes the following steps:

The first step is to read a data value from one of the first to n-th capacitors having the relatively lowest reverse voltage. The second to (n-1)-th steps are to read data values from the second to (n-1)-th capacitors in ascending order of magnitude of their reverse voltages, consecutively. The n-th step is to read a data value from one of the first to n-th capacitors having the relatively highest reverse voltage.

With the method of reading a data value according to the third aspect, the data values are read from the first to n-th capacitors in ascending order of magnitude of their reverse voltages, consecutively. Therefore, after one of the first to n-th capacitors having the relatively lowest reverse voltage is read, another of the first to n-th capacitors having the next to the relatively lowest reverse voltage is read.

In this stage, since the reverse voltage of the former capacitor is lower than that of the latter, if an applied pulse of a voltage is higher than the relatively lowest reverse voltage and lower than the next to the relatively highest reverse voltage, the data value can be read from the latter capacitor and at the same time, the data values that has not been read from the former capacitor is not changed.

The direction or polarity of the polarization prior to the application of the pulse of the voltage can be determined by the magnitude of the current flowing from the capacitor.

Accordingly, the respective data values can be read from the first to n-th ferroelectric capacitors of the ferroelectric memory cell according to the first aspect without arising any problem.

In a preferred embodiment of the third aspect, each of the first to n-th reading steps is performed by applying a voltage to a corresponding one of the first to n-th capacitors. The voltage has a value capable of converting a direction of electric polarization. The state of the data value thus read out is distinguished by the magnitude of a current flowing out from the corresponding one of the first to n-th capacitors.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to FIGS. 3 to 14.

Figure 1:
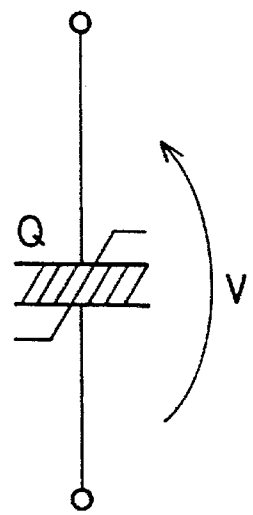
FIG. 1 is an equivalent circuit diagram of a conventional ferroelectric memory cell.
Figure 2:
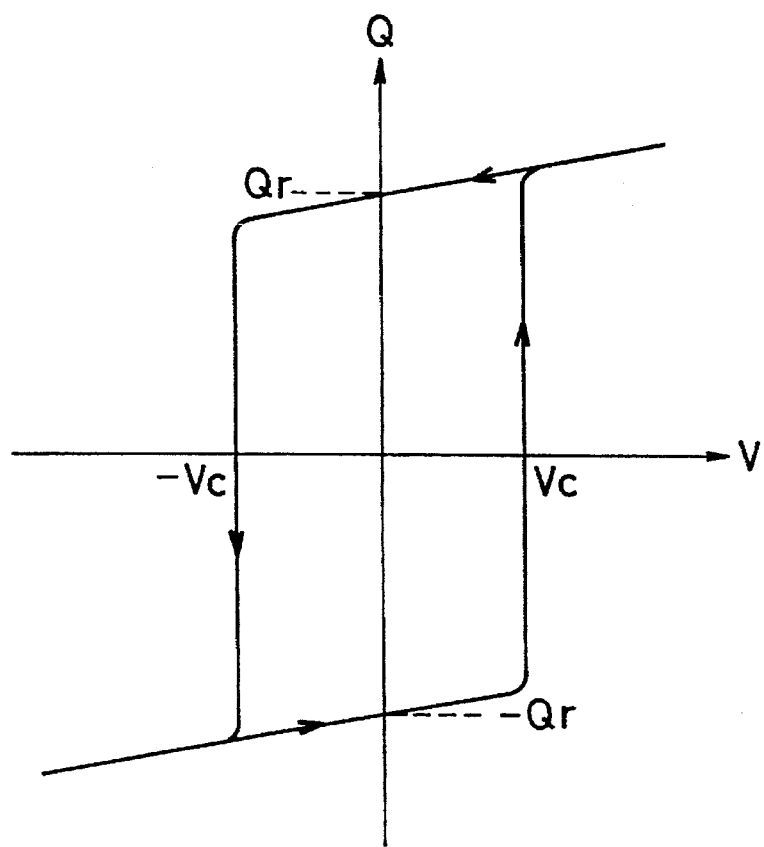
FIG. 2 shows the plot of the V-Q characteristic of the conventional cell of FIG. 1.
Figure 3:
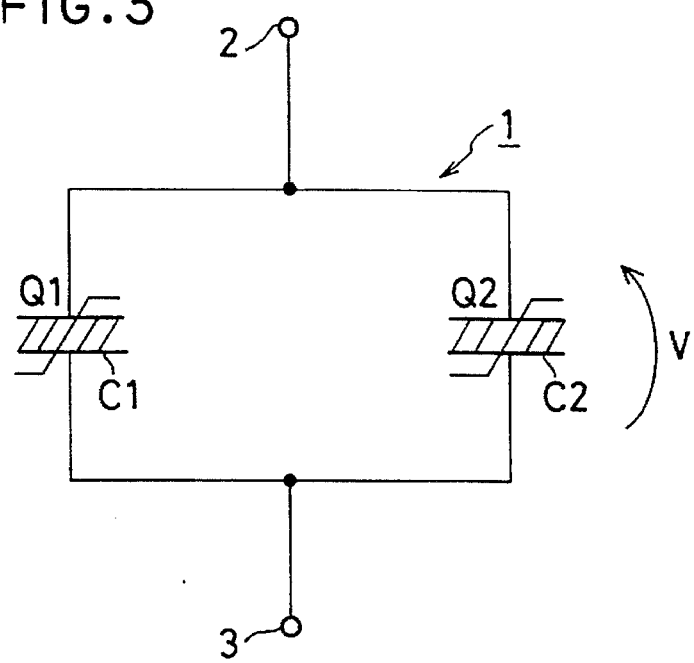
FIG. 3 is an equivalent circuit diagram of a ferroelectric memory cell according to a first embodiment of the invention.
Figure 4:
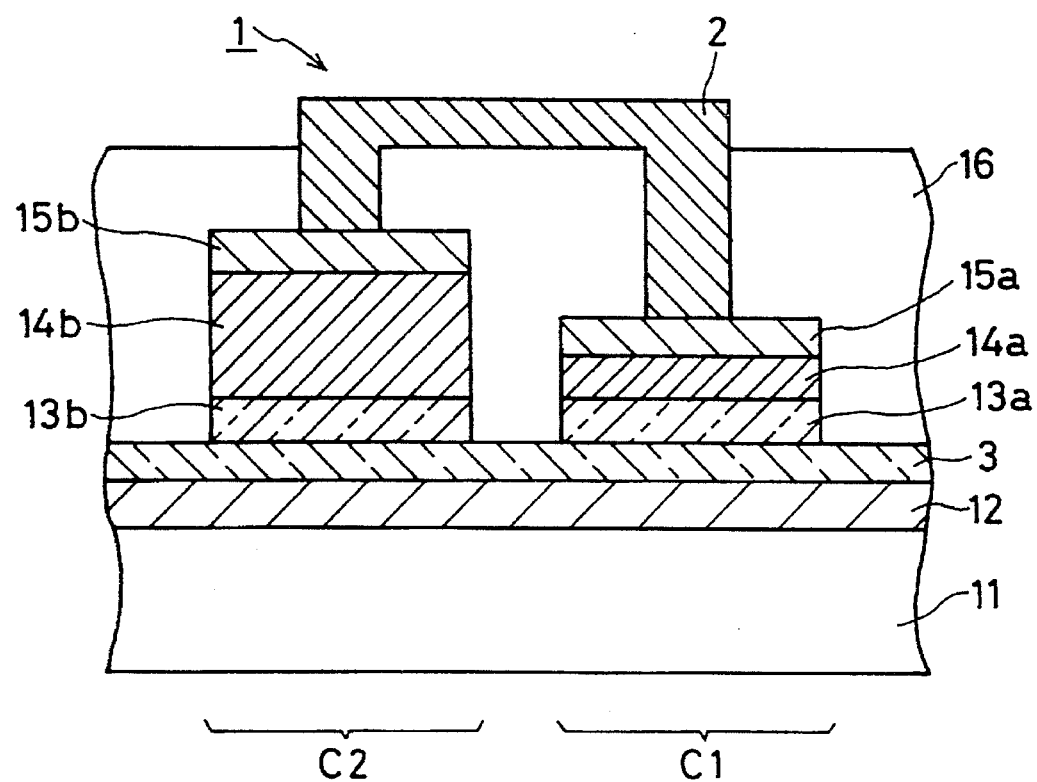
FIG. 4 is a schematic, partial cross-sectional view of the ferroelectric memory cell according to the first embodiment.

As shown in FIG. 3, a ferroelectric memory cell 1 according to a first embodiment contains first and second ferroelectric capacitors C1 and C2 connected in parallel. The concrete structure of the cell 1 is shown in FIG. 4.

Specifically, a silicon dioxide ($SiO_2$) film 12 is formed on a silicon substrate 11. A common lower electrode 3 is formed on the $SiO_2$ film 12, which is made of a patterned aluminum (Al) film. A first lower electrode 13a and a second lower electrode 13b are formed apart on the common lower electrode 3, which are made of a patterned platinum (Pt) film.

A patterned first ferroelectric film 14a of lead zirconate titanate ($PbZr_{1-x}Ti_xO_3$, x=0.47), which is termed "PZT", is formed on the first lower electrode 13a. A patterned second ferroelectric film 14b of the same PZT is formed on the second lower electrode 13b. The film 14a has a thickness of 0.3 μm and the film 14b has a thickness of 1.0 μm. Thus, the film 14b is thicker than the film 14a, resulting in reverse voltage difference between the capacitors C1 and C2.

A first upper electrode 15a and a second upper electrode 15b are formed on the first and second ferroelectric films 14a and 15b, respectively. A passivation film 16 is formed on the exposed common lower electrode 3 to cover the two Pt/PZT/Pt stacked structures for the capacitors C1 and C2.

A common upper electrode 2 is formed on the passivation film 16, which is made of a patterned Al film. The common upper electrode 2 is contacted with the first and second upper electrodes 15a and 15b through corresponding contact holes of the passivation film 16, respectively.

The first and second capacitors C1 and C2 has the same square plan shape of 10 μm×10 μm. The capacitors C1 and C2 have different reverse voltages of 1.5 V and 4 V, respectively, which is due to the thickness difference of the PZT films 14a and 14b, in other words, due to the difference between the distance between the first upper and lower electrodes 13a and 15a and that for the second upper and lower electrodes 13b and 15b.

The ferroelectric memory cell 1 is fabricated by the following manner:

First, the $SiO_2$ film 12 is formed on the silicon substrate 11 by a thermally oxidation process. Next, an Al film is formed on the $SiO_2$ film 12 by a sputtering process, and is patterned by an etching process to produce the common lower electrode 3.

A Pt film is selectively formed on the common lower electrode 3 by a sputtering process, producing the first and second lower electrodes 13a and 13b to be contacted with the common lower electrode 3.

Then, a PZT film having a thickness of 1.0 μm is formed on the lower common electrode 3 to cover the first and second lower electrodes 13a and 13b by a sputtering process. The PZT film is then removed selectively by a dry etching process to have a reduced thickness of 0.3 μm on the area for the first capacitor C1.

Subsequently, a Pt film is selectively formed on the common lower electrode 3 by a sputtering process to cover the first and second patterned ferroelectric films 14a and 14b. The Pt film is then patterned, producing the first and second upper electrodes 15a and 15b on the films 14a and 14b, respectively.

The Pt/PZT/Pt stacked structure is selectively removed by an ion milling process to be left on the areas for the capacitors C1 and C2, as shown in FIG. 4. The passivation film 16 having contact holes is formed to cover the remaining Pt/PZT/Pt stacked structure.

Finally, an Al film is formed on the passivation film 16 to be patterned, producing the upper common electrode 2 to be contacted with the first and second upper electrodes 15a and 15b through the contact holes of the film 16.

Thus, the ferroelectric memory cell 1 according to the first embodiment shown in FIGS. 3 and 4 is obtained.

With the ferroelectric memory cell 1 according to the first embodiment, the first and second ferroelectric capacitors C1 and C2 that are connected in parallel and that have different reverse voltages from each other are provided. Also, each of the first to n-th capacitors stores a two-valued information. Therefore, the memory cell 1 can store $2^n$ data values therein.

In addition, since the memory cell 1 has parallel-connected first and second ferroelectric capacitors C1 and C2, it occupies a larger chip area than the case where only one ferroelectric capacitor is included. However, the cell 1 can serve as a multi-bit cell capable of $2^n$ data values and requires only one set of interconnection lines.

Accordingly, the total chip area of the memory cell 1 and its interconnection lines is approximately equal to that of the case where only one ferroelectric capacitor is included. As a result, the integration scale can be enhanced with restraining the chip area increase of the relating interconnections to the cell 1.

Next, the V-Q characteristics of the first and second capacitors C1 and C2 are explained below.

Figure 5:
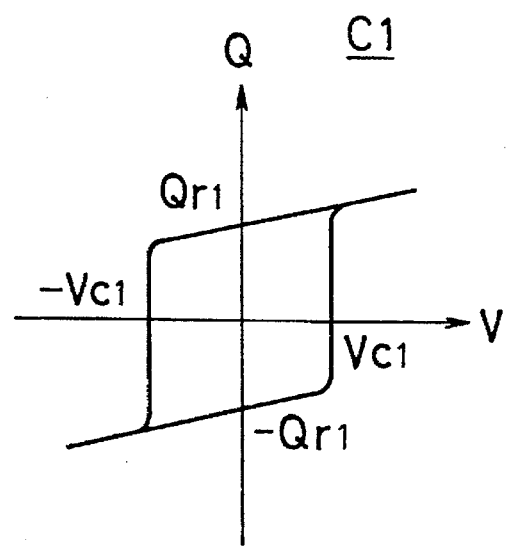
FIG. 5 shows the plot of the V-Q characteristic of the first capacitor in the ferroelectric memory cell according to the first embodiment.
Figure 6:
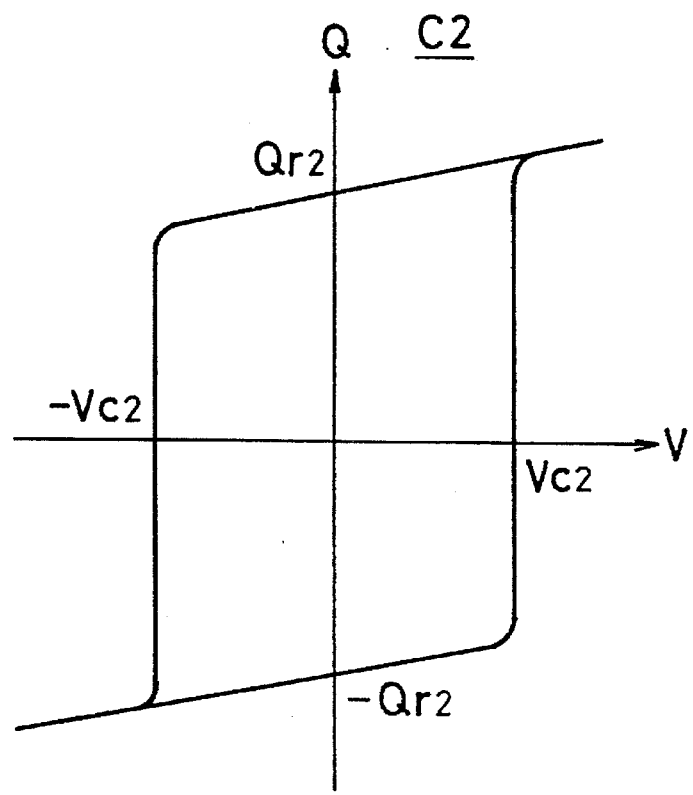
FIG. 6 shows the plot of the V-Q characteristic of the second capacitor in the ferroelectric memory cell according to the first embodiment.

The first and second capacitors C1 and C2 have the V-Q characteristics as shown in FIGS. 5 and 6, respectively, each of which contains the hysteresis loop. The first capacitor C1 has two reverse voltages $+V_{c1}$ and $-V_{c1}$. The second capacitor C2 has two reverse voltages $+V_{c2}$ and $-V_{c2}$, where $+V_{c2}>+V_{c1}$ and $-V_{c2}<-V_{c1}$. In other words, the absolute value of $+V_{c2}$ and $-V_{c2}$ is greater than that of $+V_{c1}$ and $-V_{c1}$, that is, $|V_{c2}|>|V_{c1}|$.

The ferroelectric memory cell 1 contains the first and second capacitors C1 and C2 connected in parallel. Consequently, it has the V-Q characteristic produced by combining the V-Q characteristics of the capacitors C1 and C2 with each other, which is shown in FIG. 7.

Figure 7:
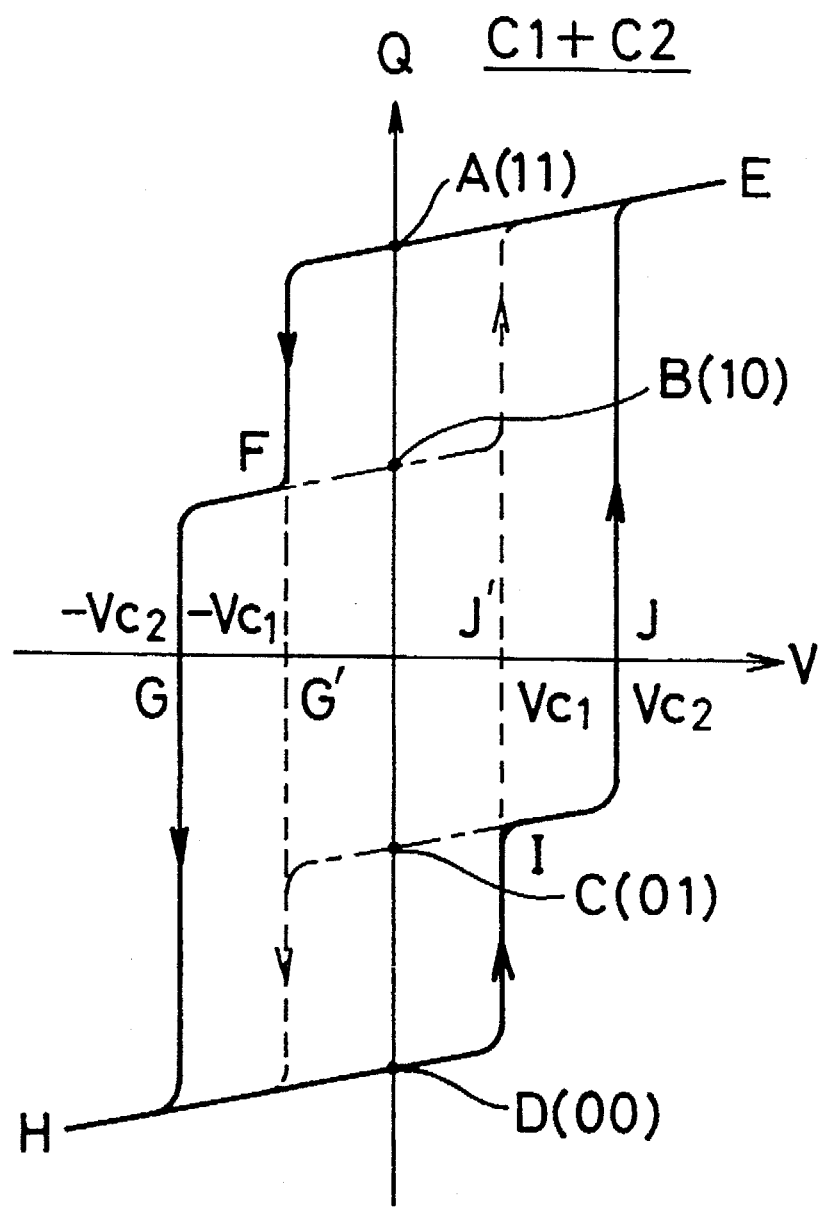
FIG. 7 shows the plot of the V-Q characteristic of the ferroelectric memory cell according to the first embodiment, in which the first and second capacitors are combined with each other.
Figure 8:
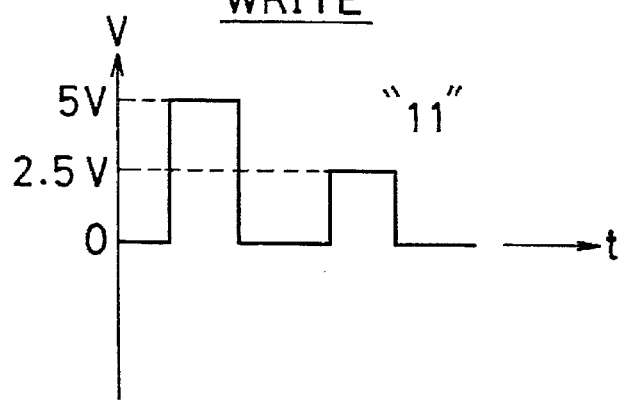
FIG. 8 is a timing diagram showing the pulse of voltage applied on a write operation in the ferroelectric memory cell according to the first embodiment, in which the data value "11" is written.
Figure 9:
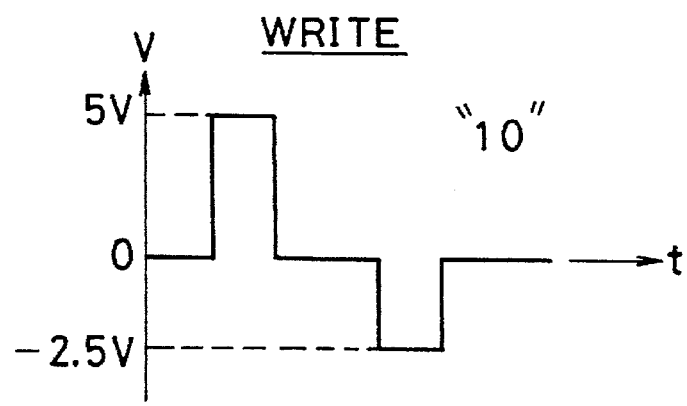
FIG. 9 is a timing diagram showing the pulse of voltage applied on a write operation in the ferroelectric memory cell according to the first embodiment, in which the data value "10" is written.
Figure 10:
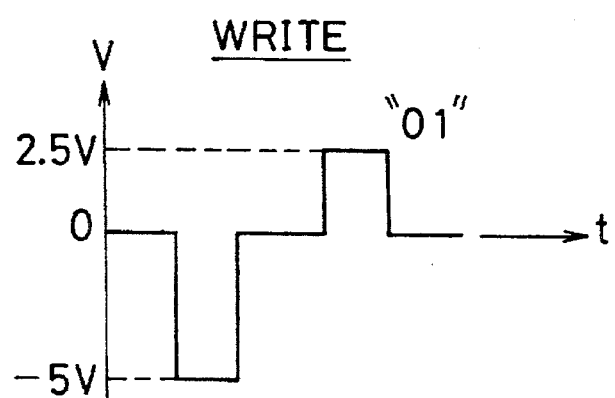
FIG. 10 is a timing diagram showing the pulse of voltage applied on a write operation in the ferroelectric memory cell according to the first embodiment, in which the data value "01" is written.
Figure 11:
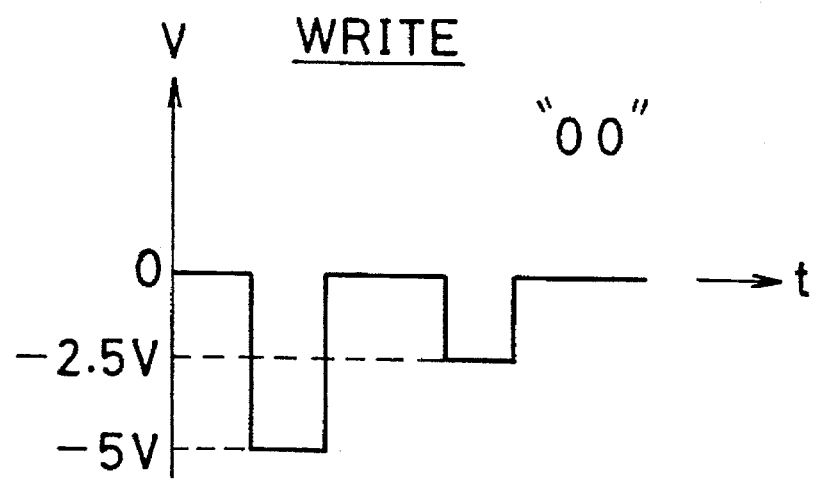
FIG. 11 is a timing diagram showing the pulse of voltage applied on a write operation in the ferroelectric memory cell according to the first embodiment, in which the data value "00" is written.

It is seen from FIG. 7 that the characteristic curve intersects the axis of ordinate (or Q-axis) at four points A, B, C and D. This means that if four values or states of an information are assigned to the four remanent charges at the points A, B, C and D, respectively, the information can be stored in the ferroelectric capacitor. This means that four ($=2^2$)-valued memory cell can be realized.

On a write operation of the memory cell 1, the magnitude and/or polarity of the applied voltage are changed along the relatively larger hysteresis loop (E→A→F→G→H→D→I→J→E) shown by the solid line in FIG. 7 in a first step. In this step, the reverse voltages are +$V_{c2}$ (at the point J) and -$V_{c2}$ (at the point G).

Thereafter, the magnitude and/or polarity of the applied voltage are changed along the relatively smaller hysteresis loop (E→A→F→G'→H→D→I→J'→E) shown by the broken line in FIG. 7 in a second step. In this step, the reverse voltages are +$V_{c1}$ (at the point J') and -$V_{c1}$ (at the point G').

On a read operation of the memory cell 1, the above first and second steps are performed in an opposite order to that on the write operation.

Here, in general, the hysteresis loop of the Q-V characteristic changes dependent on the size of a capacitor. Unlike this, the hysteresis loop of the characteristic of polarization P and electric field E, i.e., P-E characteristic is inherent in the dielectric material, and it is independent of the size of a capacitor.

Q, V, P and E have the following relationships as V=E·d, and Q=(P+$\epsilon_0$·E)A≈P·A, where d is a thickness of the ferroelectric film, A is an area of the electrode, $\epsilon_0$ is a dielectric constant in vacuum.

The reverse voltage $V_c$ satisfies the relationship as $V_c$=$E_c$·d. In consideration with the fact that $E_c$ is inherent in the material, it is known that the Q-V characteristic as shown in FIG. 7 can be realized by using (a) a ferroelectric material having different thickness d, or (b) different ferroelectric materials. In this embodiment, the former (a) is taken.

The inventor practically fabricated the above memory cell 1 and performed some tests about it. In the following description, when each of the first and second capacitors C1 and C2 has a positive polarization, the state is expressed as "1", and when each of them has a negative polarization, the state is expressed as "0". Also, the first and second capacitors C1 and C2 correspond to lower and higher bits, respectively. Therefore, the four states of the two capacitors C1 and C2 are expressed as "00", "01", "10" and "11".

First, a data value is written into the second capacitor C2 with the relatively higher reverse voltages +$V_{c2}$ and -$V_{c2}$ using a pulse of a high voltage of +5 V or -5 V. Then, it is written into the first capacitor C1 with the relatively lower reverse voltages +$V_{c1}$ and -$V_{c1}$ using a pulse of a low voltage of +2.5 V or -2.5 V. The applied pulses of the voltage are shown in FIGS. 8, 9, 10 and 11.

When the same data value is written into the first and second capacitors C1 and C2, that is, both of the cell states are "11or "00", the pulse of the voltage to be applied to the first capacitor C1 can be omitted.

Also, a deleting pulse of a relatively higher reverse voltage may be additionally applied in advance to make the directions of polarization the same (or, to reset) for both of the capacitors C1 and C2. In this case, an additional advantage that a part of the writing pulses of the voltage can be cancelled.

Figure 12:
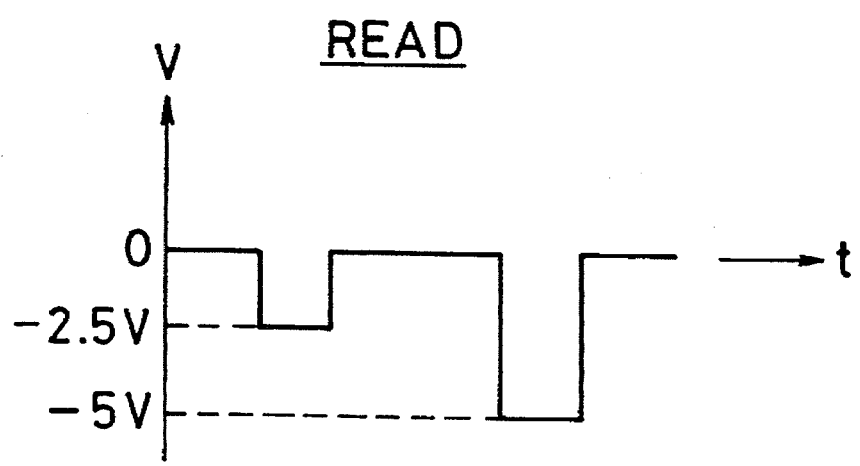
FIG. 12 is a timing diagram showing the pulse of voltage applied on a read operation in the ferroelectric memory cell according to the first embodiment.

Using the above pulses of the voltage, data values were written into the first and second capacitors C1 and C2 of the memory cell 1. Then, the cell 1 was left at room temperature for one minute while the applied voltages were kept zero. Subsequently, a read pulse of a negative voltage of -2.5 V, which is shown in FIG. 12, was applied to the capacitor C1 and then, a read pulse of a negative voltage of -5 V, which is also shown in FIG. 12, was applied to the capacitor C2.

Figure 13:
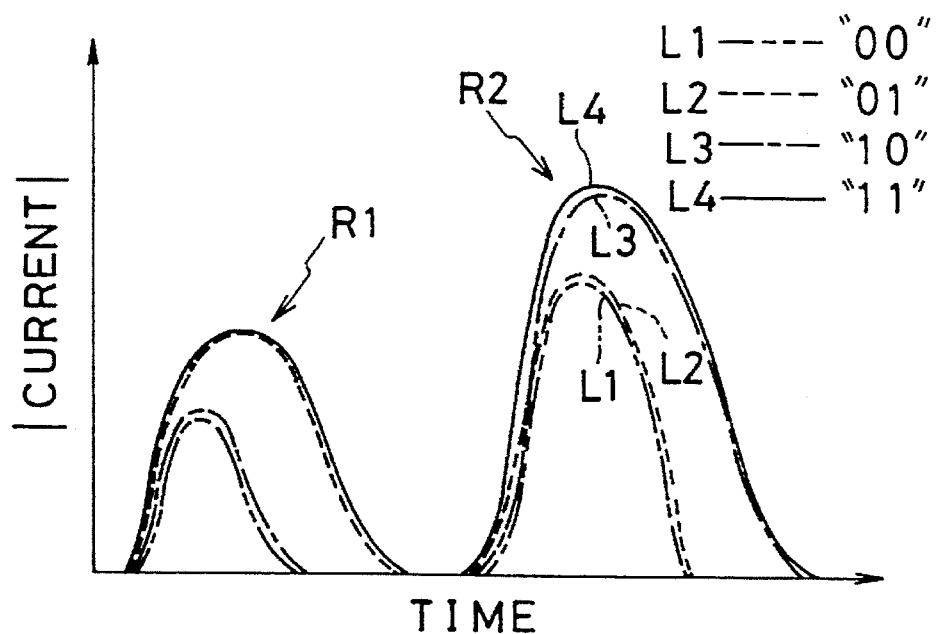
FIG. 13 is a diagram showing the time-dependent change of a current flowing on a read operation in the ferroelectric memory cell according to the first embodiment.

FIG. 13 shows the time-dependent change of an output current flowing from the capacitors C1 or C2 the states of which were "00", "01", "10" and "11" on a read operation. In FIG. 13, the two-dot chain curved line L1 shows the current from the capacitors C1 and C2 whose stored data values are "00", the chain curved line L2 shows the current for the values of "01", the broken curved line L3 shows the current for the values of "10", and the solid Curved line L4 shows the current for the values of "11".

As shown in FIG. 13, the current curves L1, L2, L3 and L4 have twin peaks R1 and R2, which were generated by application of the reading voltage pulses. The peaks R1 and R2 correspond to the reading operations from the capacitor C1 (a lower bit) and C2 (a higher bit), respectively.

It is seen from FIG. 13 that the output current changes whether the written or stored data value is "1" or "0" on the reading operation. This is caused by the following reason.

When the written data value is "0", i.e., the capacitor has a negative polarization, no reversal of the polarization occurs by an applied pulse of a negative volt, producing a lower current. On the other hand, when the written data value is "1", i.e., the capacitor has a positive polarization, a reversal of the polarization occurs by an applied pulse of a negative volt, producing a higher current than the case where the written data value is "0" and no reversal of the polarization occurs.

A pulse of a positive voltage may be used on a read operation. In the case, when the written data value is "0" and a reversal of the polarization occurs to produce a higher current. On the other hand, when the written data value is "1", no reversal of the polarization occurs to produce a lower current.

Due to these tests, it was found that the ferroelectric memory cell 1 according to the first embodiment had a performance that a multi-bit information can be written thereinto and read it therefrom reliably, which is basic operations of memory cells.

In addition, a test for confirming the nonvolatility of the cell 1 was performed, in which the period from a write operation to a read operation was changed from one second to one day. As a result, no change was observed in the output current on a read operation. This means that the read operation could be carried out correctly.

Further, when the order of the two pulses shown in FIGS. 8 to 11 was replaced with each other, that is, the pulse of 2.5 V or -2.5 V was applied to the capacitors C1 and C2 prior to that of 5 V or -5 V, no writing operation to the respective capacitors C1 and C2 could be performed independently even if the reading pulse shown in FIG. 12 was applied. The output currents for the data values of "00" and "01" were the same as that for "00". The output currents for the data values of "10" and "11" were the same as that for "11".

These results are caused by the fact that the polarization caused by the prior pulses of the lower voltage of +2.5 V or -2.5 V is changed by the application of the following pulses of the higher voltage of 5 or -5 V.

Further in addition, when the order of the two pulses shown in FIG. 12 was replaced with each other, that is, the pulse of -2.5 V was applied to the capacitors C1 and C2 prior to that of -5 V, no reading operation to the respective capacitors C1 and C2 could be performed independently even if the writing pulse shown in FIGS. 8, 9, 10 or 11 was applied.

These results are caused by the following fact. In this case, after the data value stored in the second capacitor C2 was read out by the prior pulse of the higher voltage of -5 V, the data value stored in the first capacitor C1 was read out by the following pulse of the lower voltage of −2.5 V. Therefore, only a low output current flows and no polarization was caused. The reason is that even if the state of the capacitor C1 is "1", in other words, it contains a positive polarization, the polarization of the capacitor C1 whose reverse voltage is low was reversed by the prior pulse of the high voltage on the read operation for the capacitor C2.

Figure 14:
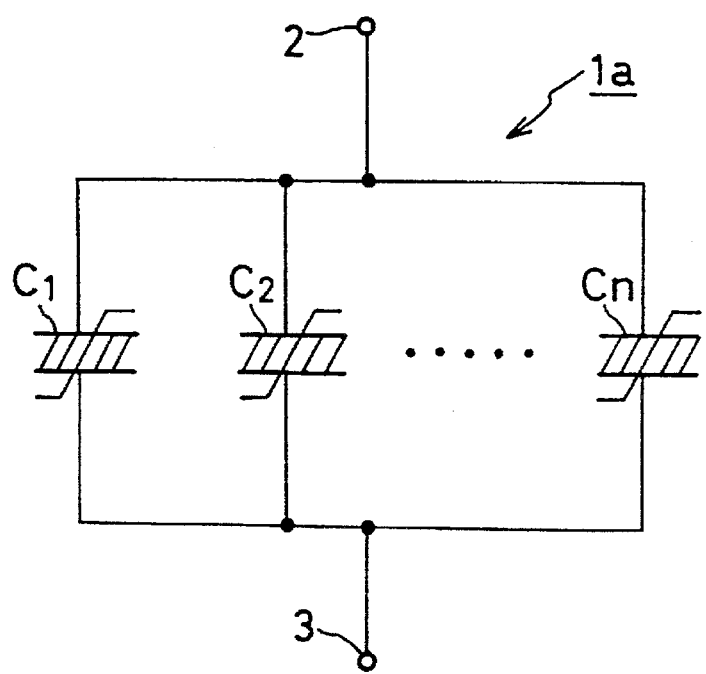
FIG. 14 is an equivalent circuit diagram of a ferroelectric memory cell according to a second embodiment of the invention.

FIG. 14 shows an equivalent circuit diagram of a nonvolatile ferroelectric memory device according to a second embodiment.

A cell 1a according to the second embodiment has the same configuration as that of the first embodiment other than that n capacitors are connected in parallel where n>2.

In this embodiment, the same effects and advantages as those in the first embodiment can be obtained. This cell 1a can store $2^n$ data values therein. The nonvolatile memory operations with multi-bit cells was confirmed.

In the above first and second embodiments, PZT is used as the ferroelectric material. However, any other ferroelectric material such as lead lanthanum zirconate titanate (PLZT) may be used.

To realize different reverse voltages for the capacitors C1 and C2, the same PZT film is used and its thickness are different from each other in the above embodiments. However, the mole fraction x of PZT may have different values.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A ferroelectric memory cell comprising:

first to n-th ferroelectric capacitors connected in parallel where n is an integer greater than unity; and said first to n-th capacitors having different reverse voltages from each other, where each of said first to n-th reverse voltages is defined as an applied voltage at which a direction of polarization is reversed;

wherein each of said first to n-th capacitors stores a two-valued information, thereby generating a function of a $2^n$-bit or $2^n$-valued memory cell.

2. A memory cell as claimed in claim 1, wherein each of said first to n-th capacitors has a ferroelectric and a pair of electrodes placed at each side of said ferroelectric;

and wherein said ferroelectric of each of said first to n-th capacitors is made of the same material and has a different thickness from each other, thereby making said first to n-th reverse voltages different.

3. A memory cell as claimed in claim 1, wherein each of said first to n-th capacitors has a ferroelectric and a pair of electrodes placed at each side of said ferroelectric;

and wherein said ferroelectric of each of said first to n-th capacitors is made of a different material from each other, thereby making said first to n-th reverse voltages different from each other.

4. A method of writing a data value into a ferroelectric memory cell;

said cell having first to n-th ferroelectric capacitors connected in parallel where n is an integer greater than unity;

said first to n-th capacitors having different reverse voltages from each other, where each of said first to n-th reverse voltages is defined as an applied voltage at which a direction of dielectric polarization is reversed; and each of said first to n-th capacitors storing a two-valued information;

each method comprising:

(a) a first step of writing a data value into one of said first to n-th capacitors having a relatively highest reverse voltage;

(b) second to (n-1)-th steps of writing data values into said second to (n-1)-th capacitors in descending order of magnitude of their reverse voltages, consecutively; and (c) an n-th step of writing a data value into one of said first to n-th capacitors having a relatively lowest reverse voltage.

5. A method as claimed in claim 4, wherein each of said first to n-th writing steps is performed by applying a pulse of voltage having a voltage value to a corresponding one of said first to n-th capacitors;

and wherein each of said voltage values has a value corresponding to a data value to be written and is capable of reversing the direction of dielectric polarization in the corresponding one of said first to n-th capacitors.

6. A method of reading a data value from a ferroelectric memory cell;

said cell having first to n-th ferroelectric capacitors connected in parallel where n is an integer greater than unity;

said first to n-th capacitors having different reverse voltages from each other, where each of said first to n-th reverse voltages is defined as an applied voltage at which a direction of dielectric polarization is reversed; and each of said first to n-th capacitors storing a two-valued information;

said method comprising:

(a) a first step of reading a data value from one of said first to n-th capacitors having a relatively lowest reverse voltage;

(b) second to (n-1)-th steps of reading data values from said second to (n-1)-th capacitors in ascending order of magnitude of their reverse voltages, consecutively; and (c) an n-th step of reading a data value from one of said first to n-th capacitors having a relatively highest reverse voltage as a last step.

7. A method as claimed in claim 6, wherein each of said first to n-th reading steps is performed by applying a voltage to a corresponding one of said first to n-th capacitors;

and wherein said voltage has a value capable of reversing the direction of dielectric polarization;

and wherein states of said data values thus read out are distinguished by the magnitude of currents flowing out from said first to n-th capacitors, respectively.

8. A ferroelectric memory cell comprising:

first to n-th ferroelectric capacitors connected in parallel where n is an integer greater than unity;

said first to n-th capacitors having different reverse voltages from each other;

each of said first to n-th reverse voltages being defined as an applied voltage at which a direction of polarization is reversed;

said first to n-th capacitors having first to n-th hysteresis curves, respectively;

said first to n-th hysteresis curves being combined, generating an overall hysteresis curve having $2^n$ different polarized states;

said $2^n$ different polarized states being assigned to data values, respectively; and each of said first to n-th capacitors storing a two-valued information, thereby generating a function of a $2^n$-bit or $2^n$-valued memory cell.

9. A memory cell as claimed in claim 8, wherein each of said first to n-th capacitors has a ferroelectric and a pair of electrodes placed at each side of said ferroelectric;

and wherein said ferroelectric of each of said first to n-th capacitors is made of the same material and has a different thickness from each other, thereby making said first to n-th reverse voltages different.

10. A memory call as claimed in claim 1, wherein each of said first to n-th capacitors has a ferroelectric and a pair of electrodes placed at each side of said ferroelectric;

and wherein said ferroelectric of each of said first to n-th capacitors is made of a different material from each other, thereby making said first to n-th reverse voltages different.

11. A method of writing a data value into a ferroelectric memory cell;

said cell having first to n-th ferroelectric capacitors connected in parallel where n is an integer greater than unity;

said first to n-th capacitors having different reverse voltages from each other, where each of said first to n-th reverse voltages is defined as an applied voltage at which a direction of dielectric polarization is reversed; and each of said first to n-th capacitors storing a two-valued information;

wherein said method comprises first to n-th steps of writing data values into said first to n-th capacitors in descending order of magnitude of their reverse voltages, which are performed consecutively.

12. A method as claimed in claim 11, wherein said first to n-th steps are performed by using first to n-th voltage pulses which are sequentially applied to said first to n-th capacitors, respectively.

13. A method as claimed in claim 11, wherein said first to n-th writing steps are performed by applying first to n-th voltage pulses whose voltages values are different from each other to said first to n-th capacitors, respectively;

and wherein each of said voltages values of said first to n-th voltage pulses corresponds to a data value to be written and is capable of reversing the direction of electric polarization in the corresponding one of said first to n-th capacitors.

14. A method of reading a data value from a ferroelectric memory cell;

said cell having first to n-th ferroelectric capacitors connected in parallel where n is an integer greater than unity;

said first to n-th capacitors having different reverse voltages from each other, where each of said first to n-th reverse voltages is defined as an applied voltage at which a direction of dielectric polarization is reversed; and each of said first to n-th capacitors storing a two-valued information;

wherein said method comprises first to n-th steps of reading data values from said first to n-th capacitors in ascending order of magnitude of their reverse voltages, which are performed consecutively.

15. A method as claimed in claim 14, wherein said first to n-th steps are performed by using first to n-th voltage pulses which are sequentially applied to said first to n-th capacitors, respectively.

16. A method as claimed in claim 14, wherein said first to n-th reading steps are performed by applying first to n-th voltage pulses whose voltage values are different from each other to said first to n-th capacitors, respectively;

and wherein each of said voltage values of said first to n-th voltage pulses corresponds to a data value to be read out and is capable of reversing the direction of dielectric polarization in the corresponding one of each of said first to n-th capacitors;

and wherein states of said data values thus read out are distinguished by the magnitude of currents flowing out from said first to n-th capacitors, respectively.

* * * * *